United States Patent
Kajigaya et al.

(10) Patent No.: US 7,309,392 B2
(45) Date of Patent: Dec. 18, 2007

(54) LITHIUM NIOBATE SUBSTRATE AND METHOD OF PRODUCING THE SAME

(75) Inventors: Tomio Kajigaya, Hokkaido (JP); Takashi Kakuta, Hokkaido (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 371 days.

(21) Appl. No.: 10/980,829

(22) Filed: Nov. 4, 2004

(65) Prior Publication Data
US 2005/0145165 A1 Jul. 7, 2005

(30) Foreign Application Priority Data
Nov. 25, 2003 (JP) .............................. 2003-394575

(51) Int. Cl.
*C30B 1/02* (2006.01)
(52) U.S. Cl. ............................... 117/2; 117/3; 117/940
(58) Field of Classification Search ..................... 117/2, 117/3, 940
See application file for complete search history.

(56) References Cited

U.S. PATENT DOCUMENTS

| | | | | |
|---|---|---|---|---|
| 4,565,598 A | * | 1/1986 | Seymour ..................... | 117/15 |
| 5,452,382 A | * | 9/1995 | Shionoya et al. ............. | 385/11 |
| 6,319,430 B1 | | 11/2001 | Bordui et al. | |
| 6,932,957 B2 | * | 8/2005 | Miles et al. .............. | 423/594.8 |

FOREIGN PATENT DOCUMENTS

| | | | |
|---|---|---|---|
| JP | 6-247800 | * | 9/1994 |
| JP | 11-92147 | | 4/1999 |
| JP | 11-236298 | | 8/1999 |
| JP | 2004-269300 | | 9/2004 |
| WO | WO 2004/002891 A1 | | 1/2004 |
| WO | WO 2004/030046 A1 | | 4/2004 |
| WO | WO 2004/030047 A1 | | 4/2004 |

* cited by examiner

*Primary Examiner*—Robert Kunemund
(74) *Attorney, Agent, or Firm*—Kratz, Quintos & Hanson, LLP

(57) ABSTRACT

In a method of producing a lithium niobate substrate by the use of a lithium niobate crystal grown by the Czochralski process, the lithium niobate crystal is heat-treated at a temperature of from 300° C. or more to less than 500° C. in the state the lithium niobate crystal is buried in a powder constituted of at least one element selected from the group consisting of Al, Ti, Si, Ca, Mg and C, or in the state the lithium niobate crystal is held in a container constituted of at least one element selected from the group consisting of Al, Ti, Si, Ca, Mg and C.

4 Claims, No Drawings

LITHIUM NIOBATE SUBSTRATE AND METHOD OF PRODUCING THE SAME

BACKGROUND OF THE INVENTION

1. Field of the Invention

This invention relates to a lithium niobate substrate used in surface acoustic wave devices, and more particularly to a lithium niobate substrate that can not easily cause a decrease in yield in device fabrication processes, and a method for producing the same.

2. Description of the Related Art

Lithium niobate ($LiNbO_3$; hereinafter often "LN") crystals are artificial ferroelectric crystals having a melting point of about 1,250° C. and a Curie temperature of about 1,140° C. Then, LN substrates (hereinafter simply often "substrate(s)") obtained from LN crystals are chiefly used as a material for surface acoustic wave devices (SAW filters) for removing signal noise of cellular telephones.

The SAW filter (surface acoustic wave device) has a structure wherein thin films of a metal such as AlCu alloy form a pair of comb electrodes on a substrate made up of a piezoelectric material which includes the LN. These comb electrodes play an important role which governs the polarity of the device. Also, to form the comb electrodes, a metal thin film is formed on the piezoelectric material by sputtering and thereafter, leaving a pair of comb patterns, unnecessary portions are removed by etching by a photolithographic technique.

LN single crystals serving as a material for SAW filters are also chiefly obtained by the Czochralski process, in which, usually using a platinum crucible, a crystal is grown in an electric furnace having an atmosphere of a nitrogen-oxygen mixed gas with an oxygen concentration of about 20%, then cooled at a stated cooling rate in the electric furnace, and thereafter taken out of the electric furnace to obtain the crystal.

The LN crystal thus grown is colorless and transparent, or takes on pale yellow color with a high feeling of transparency. After it has been grown, it is, in order to remove any residual strain due to thermal stress of the crystal, subjected to heat treatment under soaking at a temperature close to its melting point, and is further subjected to poling treatment for making it single-polarized, i.e., a series of treatment in which the LN crystal is heated from room temperature to a stated temperature of Curie temperature or more, voltage is applied to the crystal, the temperature is dropped to a stated temperature of Curie temperature or less as the voltage is kept applied, and thereafter the application of voltage is stopped to cool the crystal to room temperature. After the poling treatment, the LN crystal, which has been abraded on its peripheral surface in order to adjust the external shape of the crystal (the one obtained here is hereinafter an "ingot"), is made into a substrate through mechanical working such as slicing, lapping and polishing steps. The substrate obtained finally is substantially colorless and transparent, and has a volume resistivity of about $10^{15}$ Ω·cm.

Now, in the substrate obtained by such a conventional method, because of its pyroelectric property which is characteristic of the LN crystal in the fabrication process for the surface acoustic wave device (SAW filter), the substrate surface may come charged up (come full of electric charges) as a result of temperature changes the crystal undergoes in the process. This may produce a spark which makes the cause of destruction of the comb electrodes formed on the substrate surface, and may further cause breakage or the like of the substrate, resulting in a decrease in yield in the device fabrication process.

There is also brought about a problem that, because of a high light transmittance of the substrate, the light transmitted through the interior of the substrate in a photolithographic process which is one of steps in the device fabrication process is reflected on the back of the substrate and returns to the surface to make poor the resolution of a pattern formed.

Accordingly, to solve this problem, as disclosed in Japanese Patent Applications Laid-open No. H11-92147 and No. 11-236298, a method is proposed in which, within the range of from 500 to 1,140° C., the LN crystal is exposed to a chemical reducing atmosphere which is an atmosphere of argon, water, hydrogen, nitrogen, carbon dioxide, carbon monoxide, oxygen, or a gas selected from combination of any of these to effect blackening to thereby restrain the high light transmittance of the substrate and also enhance its electrical conductivity so that the light returning from the back of the substrate can be restrained and at the same time the pyroelectric property can be reduced. Incidentally, as a result of the above heat treatment thus made, the LN crystal, having been colorless and transparent, turns colored and opaque. Then, this phenomenon in which it turns colored and opaque is herein called blackening, because the color tone of the colored and opaque crystal looks brown to black through transmitted light.

Now, in the method disclosed in Japanese Patent Applications Laid-open No. H11-92147 and No. 11-236298, the LN crystal is heated to a high temperature of 500° C. or more. Hence, the treatment time is short on the one hand but on the other hand the blackening tends to come non-uniform between treatment batches, and also there has been a problem that color non-uniformity due to blackening, i.e., in-plane distribution of volume resistivity tends to occur in the substrate having been heat-treated, and the decrease in yield in the device fabrication process can not still be prevented sufficiently.

SUMMARY OF THE INVENTION

The present invention has been made taking note of such problems. Accordingly, an object of the present invention is to provide a lithium niobate substrate that may less cause the color non-uniformity due to blackening, i.e., in-plane distribution of volume resistivity in the substrate having been heat-treated, in spite of heat treatment at a low temperature of less than 500° C., and provide a method of producing the same.

That is, a lithium niobate substrate according to a first embodiment of the present invention is characterized by having a heat history in which a lithium niobate crystal has been heat-treated at a temperature of from 300° C. or more to less than 500° C. in the state the lithium niobate crystal is buried in a powder constituted of at least one element selected from the group consisting of Al, Ti, Si, Ca, Mg and C, or in the state the lithium niobate crystal is held in a container constituted of at least one element selected from the group consisting of Al, Ti, Si, Ca, Mg and C.

A lithium niobate substrate according to a second embodiment of the present invention is also characterized by having a heat history in which a lithium niobate crystal has been heat-treated at a temperature of from 300° C. or more to less than the melting point of Zn in the state the lithium niobate crystal is buried in a powder of Zn, or in the state the lithium niobate crystal is held in a container constituted of Zn.

A lithium niobate substrate production method according to a first embodiment of the present invention presupposes a method of producing a lithium niobate substrate by the use of a lithium niobate crystal grown by the Czochralski process, and is characterized by heat-treating the lithium niobate crystal at a temperature of from 300° C. or more to less than 500° C. in the state the lithium niobate crystal is buried in a powder constituted of at least one element selected from the group consisting of Al, Ti, Si, Ca, Mg and C, or in the state the lithium niobate crystal is held in a container constituted of at least one element selected from the group consisting of Al, Ti, Si, Ca, Mg and C; and a lithium niobate substrate production method according to a second embodiment of the present invention is also characterized by heat-treating the lithium niobate crystal at a temperature of from 300° C. or more to less than the melting point of Zn in the state the lithium niobate crystal is buried in a powder of Zn, or in the state the lithium niobate crystal is held in a container constituted of Zn.

According to the present invention, in spite of the treatment at a low temperature of less than 500° C., it is possible to provide a lithium niobate substrate that may less cause the color non-uniformity due to blackening, i.e., in-plane distribution of volume resistivity.

Therefore, it does not come about that the substrate surface comes charged up as a result of temperature changes the crystal undergoes in the device fabrication process, to produce a spark which makes the cause of destruction of the comb electrodes formed on the substrate surface and may further cause breakage or the like of the substrate. It also does not come about that the light transmitted through the interior of the substrate in a photolithographic process is reflected on the back of the substrate and returns to the surface to make poor the resolution of a pattern formed. Hence, the decrease in yield in the device fabrication process can sufficiently be prevented.

DESCRIPTION OF THE PREFERRED EMBODIMENTS

The present invention is described below in detail.

First, the LN crystal changes in electrical conductivity and color depending on the concentration of oxygen voids present in the crystal. Once the oxygen voids have been introduced into the LN crystal, the valence number of some Nb ions changes from 5+ to 4+ because of the necessity to keep charge balance, so that the crystal comes electrically conductive and at the same time causes absorption of light.

Electrical conduction is considered to take place because electrons which are carriers migrate between Nb5+ ions and Nb4+ ions. The electrical conductivity of crystals is determined by the product of the number of carriers per unit volume and the mobility of carriers. If the mobility is identical, the electrical conductivity is proportional to the number of oxygen voids. Color change caused by the absorption of light is considered to depend on the level of electrons having been introduced by the oxygen voids.

The number of oxygen voids can be controlled by what is called in-atmosphere heat treatment. The concentration of oxygen voids in a crystal kept at a specific temperature changes in such a way that it equilibrates to the oxygen potential (oxygen concentration) of an atmosphere in which the crystal is placed. Where the oxygen concentration of an atmosphere becomes lower than the equilibrium concentration, the concentration of oxygen voids in the crystal increases. Also, making temperature higher while making the oxygen concentration of an atmosphere constant brings an increase in the concentration of oxygen voids even where the oxygen concentration of an atmosphere is lower than the equilibrium concentration. Accordingly, in order to make the concentration of oxygen voids higher to enhance opacity, a higher temperature may be set and the oxygen concentration of an atmosphere may be made lower.

In the LN crystal, its bond has strong ionic properties, and hence its voids disperse at a relatively high speed. However, in-crystal oxygen dispersion is required for the change in the concentration of oxygen voids, and hence the crystal must be retained in an atmosphere for a certain time. This speed of dispersion depends greatly on the temperature, and, in the vicinity of room temperature, the concentration of oxygen voids does not change during an actual time. Accordingly, in order to obtain an opaque LN crystal in a short time, the crystal must be retained in an atmosphere with a low oxygen concentration, at a temperature where sufficient oxygen dispersion speed is achievable. After treatment, the crystal may immediately be cooled, whereby a crystal kept to have the concentration of oxygen voids having been introduced at a high temperature can be obtained at room temperature.

Now, the pyroelectric effect (pyroelectric property) comes from the deformation of lattices that is caused by changes in temperature of the crystal. In a crystal having electrical dipoles, the pyroelectric effect is understood to come about because the distance between the dipoles changes depending on the temperature. The pyroelectric effect comes about only in materials having a high electrical resistance. Upon displacement of ions, electric charges are produced on the crystal surface in the dipolar direction. In materials having a low electrical resistance, however, such electric charges are neutralized because of the electrical conductivity the crystal itself has. In usual transparent LN crystals, their volume resistivity is on the level of $10^{15}$ Ω·cm as stated previously, and hence the pyroelectric effect appears remarkably. However, in the blackened opaque LN crystal, its volume resistivity is improved to be $10^{12}$ Ω·cm or less, and hence any pyroelectric property is not seen.

The LN crystal according to the present invention is heat-treated. The heat treatment may be carried out in either of the state of the ingot and the state of a substrate, as long as it is carried out after poling treatment. Preferably, it may be carried out in the state of a substrate. Incidentally, if it is carried out before poling treatment, the oxygen voids having been introduced may inevitably be filled with oxygen unless the atmosphere at the time of poling treatment is retained to the atmosphere with a low oxygen concentration.

The heat treatment of the LN crystal is also carried out in the state it is buried in a powder constituted of at least one element selected from the group consisting of Al, Ti, Si, Ca, Mg, Zn and C, or in the state it is held in a container constituted of at least one element selected from the group consisting of Al, Ti, Si, Ca, Mg, Zn and C. The LN crystal is also heated at a temperature of 300° C. or more to less than 500° C. where the element is selected from Al, Ti, Si, Ca, Mg and C. Where Zn is selected, the upper limit of the temperature is less than the melting point of Zn because the Zn has a melting point of 419.6° C. Also, the higher the heating temperature is, the shorter time the blackening proceeds in. Hence, where the element other than Zn is selected, preferable temperature is within the range of from 450° C. to less than 500° C. The heat treatment may also preferably be carried out in an atmosphere of a vacuum or an inert gas (such as nitrogen gas or argon gas). Treatment time should be 1 hour or more. Also, where a powder constituted of any element of Al, Ti, Si, Ca, Mg and Zn is selected, it is effective to use a mixture of a powder of any of these elements and an oxide of any of these elements.

As the most preferred conditions taking account of controllability of treatment steps, properties of substrates obtained finally, uniformity of that properties, reproducibility, and so forth, it is effective to use a wafer (LN substrate) cut out from the LN crystal ingot obtained after poling, to bury the LN crystal substrate in a mixed powder of Al and $Al_2O_3$, and to carry out the heat treatment in an atmosphere of an inert gas such as nitrogen gas or argon gas, or a vacuum. Incidentally, the atmosphere of a vacuum is more desirable than the atmosphere of an inert gas because the blackening treatment can be carried out in a relatively short time.

As a practical method of judging the effect of the heat treatment, i.e., whether or not the pyroelectric property of the substrate is no longer seen, a heat cycle test is useful which is conducted under imitation of temperature changes the substrate undergoes. More specifically, a substrate is placed on a hot plate heated to 80° C., and a heat cycle is applied, where, in the case of a substrate obtained by conventional treatment, sparks are seen to take place on its surface. On the other hand, in the case of the substrate blackened by the heat treatment according to the present invention, no surface potential of the substrate comes about, and no phenomenon in which sparks take place on the surface is seen at all. Accordingly, the judgement on whether or not the blackening occurs is useful as a practical method for judging the pyroelectric property.

The present invention is described below in greater detail by giving Examples.

EXAMPLE 1

Using a raw material having congruent composition, an LN single crystal was grown by the Czochralski process in a diameter of 4 inches. It was grown in an atmosphere of a nitrogen-oxygen mixed gas having an oxygen concentration of about 20%. The crystal obtained was in transparent pale yellow.

This crystal was subjected to heat treatment for removing residual strain, under soaking, and poling treatment for making it single-polarized. Thereafter, the crystal thus treated was abraded on its peripheral surface in order to adjust the external shape of the crystal, and then sliced to form a substrate.

The substrate thus obtained was buried in an aluminum (Al) powder, and then heat-treated at 480° C. for 20 hours in an atmosphere of a vacuum.

The substrate having been treated was black, had a volume resistivity of about $10^7$ $\Omega$·cm, and was seen to have caused no color non-uniformity in visual observation. Incidentally, the volume resistivity was measured by the three-terminal method according to JIS K 6911.

Next, a heat cycle test was conducted in which the substrate, kept at room temperature, was placed on a 80° C. hot plate. As the result, the surface potential produced at the moment the substrate was placed on the hot plate was 10 V or less, and the phenomenon of sparking on the substrate surface was not seen.

The substrate obtained also had a Curie temperature of the 1,140° C., and the values of its physical properties having influence on the properties of SAW filters were not different from those of conventional products not subjected to blackening treatment.

EXAMPLE 2

The heat treatment was carried out under substantially the same conditions as those in Example 1 except that the heat treatment temperature was changed to 300° C.

The substrate obtained was brown, had a volume resistivity of about $10^{12}$ $\Omega$·cm, and was seen to have caused no color non-uniformity in visual observation.

In the heat cycle test, the surface potential produced at the moment the substrate was placed on the hot plate was 500 V or less, and the phenomenon of sparking on the substrate surface was not seen.

EXAMPLE 3

An LN crystal having been subjected to poling treatment was buried in an aluminum (Al) powder, and then heat-treated at 300° C. for 20 hours in an atmosphere of nitrogen gas.

The LN crystal obtained was brown. The LN crystal was abraded on its peripheral surface in order to adjust the external shape of the crystal, and then sliced to form a substrate. The substrate obtained was brown, had a volume resistivity of about $10^{12}$ $\Omega$·cm, and was seen to have caused no color non-uniformity in visual observation.

A heat cycle test was conducted in which this substrate was placed on the hot plate. As the result, the surface potential produced at the moment the substrate was placed on the hot plate was 500 V or less, and the phenomenon of sparking on the substrate surface was not seen.

EXAMPLE 4

The heat treatment was carried out under substantially the same conditions as those in Example 3 except that the heat treatment temperature was changed to 480° C.

The substrate obtained was black, had a volume resistivity of about $10^7$ $\Omega$·cm, and was seen to have caused no color non-uniformity in visual observation.

The heat cycle test was also conducted in which this substrate was placed on the hot plate. As the result, the surface potential produced at the moment the substrate was placed on the hot plate was 10 V or less, and the phenomenon of sparking on the substrate surface was not seen.

EXAMPLE 5

The heat treatment was carried out under substantially the same conditions as those in Example 1 except that the atmosphere was changed to an atmosphere of nitrogen gas.

The substrate obtained was black, had a volume resistivity of about $10^8$ $\Omega$·cm, and was seen to have caused no color non-uniformity in visual observation.

In the heat cycle test, the surface potential produced at the moment the substrate was placed on the hot plate was 100 V or less, and the phenomenon of sparking on the substrate surface was not seen.

EXAMPLE 6

The heat treatment was carried out under substantially the same conditions as those in Example 1 except that the heat treatment temperature was changed to 1 hour.

The substrate obtained was brown, had a volume resistivity of about $10^{12}$ $\Omega$·cm, and was seen to have caused no color non-uniformity in visual observation.

In the heat cycle test, the surface potential produced at the moment the substrate was placed on the hot plate was 500 V or less, and the phenomenon of sparking on the substrate surface was not seen.

EXAMPLE 7

The heat treatment was carried out under substantially the same conditions as those in Example 1 except that a Ti powder was used in place of the aluminum (Al) powder.

The substrate obtained was brown, had a volume resistivity of about $10^{10}$ $\Omega$·cm, and was seen to have caused no color non-uniformity in visual observation.

In the heat cycle test, the surface potential produced at the moment the substrate was placed on the hot plate was 300 V or less, and the phenomenon of sparking on the substrate surface was not seen.

EXAMPLE 8

The heat treatment was carried out under substantially the same conditions as those in Example 1 except that an Si powder was used in place of the aluminum (Al) powder.

The substrate obtained was brown, had a volume resistivity of about $10^{10}$ $\Omega\cdot$cm, and was seen to have caused no color non-uniformity in visual observation.

In the heat cycle test, the surface potential produced at the moment the substrate was placed on the hot plate was 300 V or less, and the phenomenon of sparking on the substrate surface was not seen.

EXAMPLE 9

The heat treatment was carried out under substantially the same conditions as those in Example 1 except that a Ca powder was used in place of the aluminum (Al) powder.

The substrate obtained was black, had a volume resistivity of about $10^7$ $\Omega\cdot$cm, and was seen to have caused no color non-uniformity in visual observation.

In the heat cycle test, the surface potential produced at the moment the substrate was placed on the hot plate was 10 V or less, and the phenomenon of sparking on the substrate surface was not seen.

EXAMPLE 10

The heat treatment was carried out under substantially the same conditions as those in Example 1 except that an Mg powder was used in place of the aluminum (Al) powder.

The substrate obtained was black, had a volume resistivity of about $10^7$ $\Omega\cdot$cm, and was seen to have caused no color non-uniformity in visual observation.

In the heat cycle test, the surface potential produced at the moment the substrate was placed on the hot plate was 10 V or less, and the phenomenon of sparking on the substrate surface was not seen.

EXAMPLE 11

The heat treatment was carried out under substantially the same conditions as those in Example 1 except that a C powder was used in place of the aluminum (Al) powder.

The substrate obtained was brown, had a volume resistivity of about $10^{11}$ $\Omega\cdot$cm, and was seen to have caused no color non-uniformity in visual observation.

In the heat cycle test, the surface potential produced at the moment the substrate was placed on the hot plate was 500 V or less, and the phenomenon of sparking on the substrate surface was not seen.

EXAMPLE 12

The heat treatment was carried out under substantially the same conditions as those in Example 1 except that a Zn powder was used in place of the aluminum (Al) powder and also that the heat treatment temperature was changed to 300° C.

The substrate obtained was brown, had a volume resistivity of about $10^{12}$ $\Omega\cdot$cm, and was seen to have caused no color non-uniformity in visual observation.

In the heat cycle test, the surface potential produced at the moment the substrate was placed on the hot plate was 500 V or less, and the phenomenon of sparking on the substrate surface was not seen.

EXAMPLE 13

The heat treatment was carried out under substantially the same conditions as those in Example 1 except that it was carried out in the state the substrate was held in a lidded container constituted of aluminum (Al).

The substrate obtained was black, had a volume resistivity of about $10^7$ $\Omega\cdot$cm, and was seen to have caused no color non-uniformity in visual observation.

In the heat cycle test, the surface potential produced at the moment the substrate was placed on the hot plate was 10 V or less, and the phenomenon of sparking on the substrate surface was not seen.

EXAMPLE 14

The heat treatment was carried out under substantially the same conditions as those in Example 13 except that it was carried out in the state the substrate was held in a lidded container constituted of Ti in place of the aluminum (Al).

The substrate obtained was brown, had a volume resistivity of about $10^{10}$ $\Omega\cdot$cm, and was seen to have caused no color non-uniformity in visual observation.

In the heat cycle test, the surface potential produced at the moment the substrate was placed on the hot plate was 300 V or less, and the phenomenon of sparking on the substrate surface was not seen.

EXAMPLE 15

The heat treatment was carried out under substantially the same conditions as those in Example 13 except that it was carried out in the state the substrate was held in a lidded container constituted of Si in place of the aluminum (Al).

The substrate obtained was brown, had a volume resistivity of about $10^{10}$ $\Omega\cdot$-cm, and was seen to have caused no color non-uniformity in visual observation.

In the heat cycle test, the surface potential produced at the moment the substrate was placed on the hot plate was 300 V or less, and the phenomenon of sparking on the substrate surface was not seen.

EXAMPLE 16

The heat treatment was carried out under substantially the same conditions as those in Example 13 except that it was carried out in the state the substrate was held in a lidded container constituted of Ca in place of the aluminum (Al).

The substrate obtained was black, had a volume resistivity of about $10^7$ $\Omega\cdot$cm, and was seen to have caused no color non-uniformity in visual observation.

In the heat cycle test, the surface potential produced at the moment the substrate was placed on the hot plate was 10 V or less, and the phenomenon of sparking on the substrate surface was not seen.

EXAMPLE 17

The heat treatment was carried out under substantially the same conditions as those in Example 13 except that it was carried out in the state the substrate was held in a lidded container constituted of Mg in place of the aluminum (Al).

The substrate obtained was black, had a volume resistivity of about $10^7$ $\Omega\cdot$cm, and was seen to have caused no color non-uniformity in visual observation.

In the heat cycle test, the surface potential produced at the moment the substrate was placed on the hot plate was 10 V or less, and the phenomenon of sparking on the substrate surface was not seen.

EXAMPLE 18

The heat treatment was carried out under substantially the same conditions as those in Example 13 except that it was carried out in the state the substrate was held in a lidded container constituted of C in place of the aluminum (Al).

The substrate obtained was brown, had a volume resistivity of about $10^{11}$ Ω·cm, and was seen to have caused no color non-uniformity in visual observation.

In the heat cycle test, the surface potential produced at the moment the substrate was placed on the hot plate was 500 V or less, and the phenomenon of sparking on the substrate surface was not seen.

EXAMPLE 19

The heat treatment was carried out under substantially the same conditions as those in Example 13 except that it was carried out in the state the substrate was held in a lidded container constituted of Zn in place of the aluminum (Al) and also that the heat treatment temperature was changed to 300° C.

The substrate obtained was brown, had a volume resistivity of about $10^{12}$ Ω·cm, and was seen to have caused no color non-uniformity in visual observation.

In the heat cycle test, the surface potential produced at the moment the substrate was placed on the hot plate was 500 V or less, and the phenomenon of sparking on the substrate surface was not seen.

EXAMPLE 20

The heat treatment was carried out under substantially the same conditions as those in Example 1 except that a powder prepared by mixing Al powder and $Al_2O_3$ powder in a proportion of 10:90 was used in place of the aluminum (Al) powder.

The substrate obtained was black, had a volume resistivity of about $10^8$ Ω·cm, and was seen to have caused no color non-uniformity in visual observation.

In the heat cycle test, the surface potential produced at the moment the substrate was placed on the hot plate was 100 V or less, and the phenomenon of sparking on the substrate surface was not seen.

COMPARATIVE EXAMPLE 1

Using a raw material having congruent composition, an LN single crystal was grown by the Czochralski process in a diameter of 4 inches. It was grown in an atmosphere of a nitrogen-oxygen mixed gas having an oxygen concentration of about 20%. The crystal obtained was in transparent pale yellow.

This crystal was subjected to heat treatment for removing residual strain, under soaking, and poling treatment for making it single-polarized. Thereafter, the crystal thus treated was abraded on its peripheral surface in order to adjust the external shape of the crystal, and then sliced to form a substrate.

The substrate thus obtained was heat-treated at 800° C. for 1 minute in an atmosphere of nitrogen.

The substrate having been treated was blackish-brown, but was seen to have caused color non-uniformity in visual observation. As is inferable from the fact that the color non-uniformity had occurred, the volume resistivity, though being about $10^9$ Ω·cm, had a scattering (σ/Ave) of about 30% at some measurement spots. Incidentally, the Ave is an average when measured at five spots in the substrate in-plane area, and σ is standard deviation.

POSSIBILITY OF INDUSTRIAL APPLICATION

According to the present invention, in spite of the treatment at a low temperature of less than 500° C., it is possible to provide the lithium niobate substrate that may less cause the color non-uniformity due to blackening, i.e., in-plane distribution of volume resistivity. Therefore, it does not come about that the substrate surface comes charged up as a result of temperature changes the crystal undergoes in the device fabrication process, to produce a spark which makes the cause of destruction of the comb electrodes formed on the substrate surface and may further cause breakage or the like of the substrate. It also does not come about that the light transmitted through the interior of the substrate in a photolithographic process is reflected on the back of the substrate and returns to the surface to make poor the resolution of a pattern formed. Hence, the decrease in yield in the device fabrication process can sufficiently be prevented. Thus, this substrate is suited for use in substrates for surface acoustic wave devices.

What is claimed is:

1. A method of producing a lithium niobate substrate by the use of a lithium niobate crystal grown by the Czochralski process, wherein;
    the lithium niobate crystal is heat-treated at a temperature of from 300° C. or more to less than 500° C. in the state the lithium niobate crystal is buried in a powder constituted of at least one element selected from the group consisting of Al, Ti, Si, Ca, Mg and C, or in the state the lithium niobate crystal is held in a container constituted of at least one element selected from the group consisting of Al, Ti, Si, Ca, Mg and C.

2. The method of producing a lithium niobate substrate according to claim 1, wherein the heat treatment is carried out in an atmosphere of a vacuum or an inert gas.

3. The method of producing a lithium niobate substrate according to claim 1, wherein the heat treatment is carried out for 1 hour or more.

4. The method of producing a lithium niobate substrate according to claim 2, wherein the heat treatment is carried out for 1 hour or more.

* * * * *